(12) United States Patent
Chen

(10) Patent No.: US 6,800,938 B2
(45) Date of Patent: Oct. 5, 2004

(54) SEMICONDUCTOR DEVICE HAVING AMORPHOUS BARRIER LAYER FOR COPPER METALLURGY

(75) Inventor: Fen Chen, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/215,121

(22) Filed: Aug. 8, 2002

(65) Prior Publication Data

US 2004/0026119 A1 Feb. 12, 2004

(51) Int. Cl.$^7$ .............................................. H01L 23/48
(52) U.S. Cl. ...................... 257/751; 257/750; 257/761; 257/765; 438/652; 438/653; 438/656
(58) Field of Search ................. 257/750, 751, 257/761, 765, 762; 438/653, 656, 652, 627

(56) References Cited

U.S. PATENT DOCUMENTS

| | | | |
|---|---|---|---|
| 5,372,974 A | 12/1994 | Doan et al. ................. | 437/240 |
| 5,714,418 A | 2/1998 | Bai et al. ..................... | 438/627 |
| 5,882,738 A | 3/1999 | Blish, II et al. ............. | 427/526 |
| 5,959,359 A * | 9/1999 | Tsuchiya .................... | 257/766 |
| 5,965,679 A | 10/1999 | Godschalx et al. ......... | 526/281 |
| 5,973,400 A | 10/1999 | Murakami et al. .......... | 257/751 |
| 5,977,634 A | 11/1999 | Bai et al. ..................... | 257/751 |
| 6,054,770 A * | 4/2000 | Toyoda et al. ............... | 257/762 |
| 6,103,625 A | 8/2000 | Marcyk et al. .............. | 438/691 |
| 6,229,211 B1 | 5/2001 | Kawanoue et al. .......... | 257/751 |
| 6,265,257 B1 | 7/2001 | Hsu et al. .................... | 438/215 |
| 6,291,334 B1 | 9/2001 | Somekh ....................... | 438/620 |
| 6,306,756 B1 * | 10/2001 | Hasunuma et al. .......... | 438/632 |
| 6,320,213 B1 | 11/2001 | Kirlin et al. ................. | 257/295 |
| 6,348,731 B1 * | 2/2002 | Ashley et al. ............... | 257/751 |
| 2001/0030366 A1 * | 10/2001 | Nakano et al. .............. | 257/758 |
| 2003/0022483 A1 * | 1/2003 | Shroff et al. ................. | 438/637 |

FOREIGN PATENT DOCUMENTS

WO   WO 00/03420   1/2000

OTHER PUBLICATIONS

Akira Ohta, et al., "Preparation of Ta2A1 Intermetallic Compound Films and Their Application As Diffusion Barriers To Cu Penetration", Tin Solid Films 278 (1996) pp. 6–11.

H. Toyoda, et al., "Improvement In The Electromigration Lifetime Using Hyper–Textured Aluminum Formed On Amorphous Tantalum–Aluminum Underlayer", IEEE/IRPS, 1994, pp. 178–184.

* cited by examiner

Primary Examiner—Jerome Jackson
Assistant Examiner—Matthew C Landau
(74) Attorney, Agent, or Firm—William D. Sabo

(57) ABSTRACT

A semiconductor device which includes, between a copper conductive layer and a low-k organic insulator, a barrier layer comprising an amorphous metallic glass, preferably amorphous tantalum-aluminum. A method of making the semiconductor device is also disclosed.

6 Claims, 1 Drawing Sheet

SEMICONDUCTOR DEVICE HAVING AMORPHOUS BARRIER LAYER FOR COPPER METALLURGY

BACKGROUND OF THE INVENTION

1. Technical Field

The present invention relates generally to a semiconductor device and its method of manufacture. More particularly, the present invention relates to a semiconductor device which features copper metallurgy formed on an amorphous metallic glass barrier layer, and to its method of manufacture.

2. Related Art

To provide higher speed of semiconductor devices, it has become necessary in the art to employ conductive materials of low resistivity and insulators having low-k, i.e., a dielectric constant less than about 4. For example, copper is now becoming the conductive material of choice because of its lower resistivity and better electromigration resistance as compared with aluminum. In addition, as alternatives to silicon dioxide or doped silicon dioxide, such as BPSG, which have dielectric constants above 4, insulation materials with low dielectric constant (k<4) have been investigated. For example, in U.S. Pat. No. 5,563,105, a fluorine doped silicon glass (FSG), with a dielectric constant of 3.5–3.7, is described. Also, organic materials having an even lower dielectric constant, such as about 2.7, have been developed for use as insulators. See, for example, U.S. Pat. No. 5,965,679.

For copper metallurgy, the damascene process is typically used, where copper is deposited over the entire patterned insulator surfaces to fill openings, i.e., trenches and vias, followed by planarization, e.g. using chemical mechanical polishing. When the deposition is by electroplating, a plating base or seed layer precedes the deposition, as well as other layers, such as refractory metals or refractory metal nitrides, to improve adhesion and to prevent copper diffusion into the insulator. Because the thickness of such barrier layers needs to be reduced to meet microprocessing requirements, diffusion of copper through the barrier layers into low-k insulators becomes a problem.

In particular, for temperatures for back end of the line processing, i.e., less than 450° C., thermal diffusion of copper into oxide or organic insulators is not significant. However, in the presence of an electric field and moisture, copper atoms can be chemically ionized first at the anode, then positive copper ions can migrate rapidly through low-k insulators (so-called electrochemical migration) to the cathode causing reliability problems. Further, outgassing of benzene from organic insulators, such as those described in U.S. Pat. No. 5,965,679, at high temperature can electrostatically attract positive copper ions. Due to the polycrystalline nature of conventional barrier layers, such layers always have some crystralline defects such as lattice defects, grain boundary, and segregation. Those defects, particularly grain boundary, could serve as a fast diffusion path for copper electrochemical migration. Copper diffusion through conventional barrier layers into low-k insulators can result in increased electronic leakage, increased dielectric constant and premature time-dependent dielectric fail.

Therefore, there exists a need in the industry for an improved barrier layer for copper damascene structures having low-k insulators, and an accompaning method of making such structures.

SUMMARY OF THE INVENTION

It is against this background, that the present invention introduces a barrier layer which comprises an amorphous metallic glass for use with copper conductive layers and low-k organic insulators. In general, the barrier layer serves as the primary barrier for preventing diffusion of copper into the low-k organic insulator. In addition, in use, the barrier layer is relatively thin, which allows the low resistivity characteristics of copper to be beneficially utilized in back end of the line metallurgy. The amorphous nature of the barrier layer also provides for adequate formation of a continuous and highly textured copper seed layer, when the copper is deposited in an opening by electroplating, as well as satisfactory adhesion of the copper to the low-k organic insulator.

In accordance with the invention, there is provided a semiconductor device comprising a conductive layer in an opening in an insulator, wherein the conductive layer comprises copper and the insulator comprises a low-k organic material, and further wherein the conductive layer is formed on a barrier layer which comprises an amorphous metallic glass.

Further, in accordance with the invention, there is provided a semiconductor device comprising a conductive layer in an opening in an insulator; wherein the conductive layer comprises copper; wherein the insulator comprises an oligomer, uncured polymer or cured polymer comprising the reaction product of one or more polyfunctional compounds containing two or more cyclopentadienone groups and at least one polyfunctional compound containing two or more aromatic acetylene groups wherein at least one of the polyfunctional compounds contain three or more groups selected from the group consisting of acetylene groups and cyclopentadienone groups; and a barrier layer disposed between the conductive layer and the insulator, the barrier layer comprising amorphous tantalum-aluminum, which contains about 69% to about 75% tantalum. The amorphous tantalum-aluminum alloys have ideal barrier characteristics such as structural homogeneity and the absence of crystalline defects. Their physical and electrical properties can also be adjusted by changing process conditions and compositions.

Additionally, in accordance with the invention, there is provided a method of making a semiconductor device, comprising the steps of forming an opening in an insulator which comprises a low-k organic material; forming in the opening a barrier layer which comprises an amorphous metallic glass; and forming on the barrier layer a conductive layer which comprises copper.

The foregoing and other features and advantages of the invention will be apparent from the following more particular description of embodiments of the invention.

BRIEF DESCRIPTION OF THE DRAWINGS

The embodiments of this invention will be described in detail, with reference to the following figures, wherein like designations denote like elements, and wherein.

DESCRIPTION OF THE PREFERRED EMBODIMENTS

Figure 1:
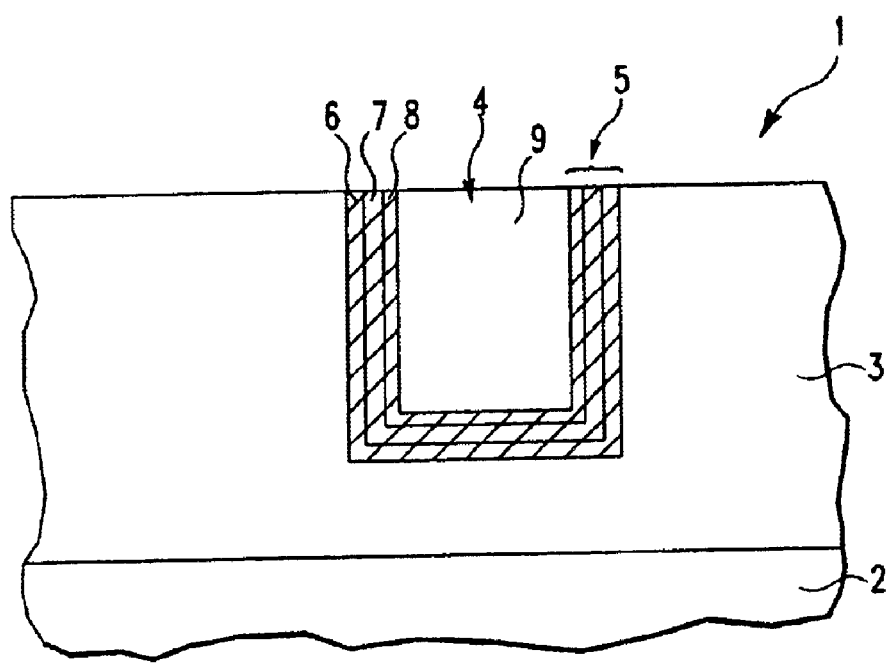
FIGS. 1 and 2 are schematic section views showing the semiconductor device of the present invention.

Referring to the drawings, FIG. 1 shows a semiconductor structure 1. In this example, the structure 1 is a damascene structure comprising a semiconductor substrate 2, typically silicon, GaAs or the like, on which devices such as capacitors and transistors are formed, having an insulator 3 thereover. In this damascene example, an opening 4 is formed within the insulator 3 of the structure 1 using conventional back end of the line techniques. As another alternative, the structure 1 may be comprised of a dual damascene structure, where the opening 4 includes a trench and a via formed within the insulator 3, as is well known to those skilled in the art.

In accordance with the invention, the insulator 3 is a low-k organic material. In a preferred embodiment, the low-k organic material is an oligomer, uncured polymer or cured polymer comprising the reaction product of one or more polyfunctional compounds containing two or more cyclopentadienone groups and at least one polyfunctional compound containing two or more aromatic acetylene groups wherein at least one of the polyfunctional compounds contain three or more groups selected from the group consisting of acetylene groups and cyclopentadienone groups.

Advantageously, such a material has an ability to fill gaps and planarize patterned surfaces, while when cured has relatively high thermal stability and high glass transistion temperature, as well as a low dielectric constant. Additional details concerning this particular material can be found in U.S. Pat. No. 5,965,679, the entire contents of which are incorporated herein by reference, as well as details concerning its preparation and use. Other low-k organic materials that can be employed as the insulator 3 will be known to those skilled in the art.

Preferably, the insulator 3 is applied by spin coating, although dip coating, spray coating, extrusion coating, etc. may be suitably employed. Typically, the insulator 3 is about 1,500 to about 5,000 Angstroms thick, and more typically about 2,000 to about 3,500 Angstroms thick.

Next, a barrier layer 5 is formed over the insulator 3 and in the opening 4. In accordance with the invention, the barrier layer 5 comprises an amorphous metallic glass having the characteristics of structural homogeneity and the absence of crystalline defects. In addition, the barrier layer may include one or more additional layers, as described in more detail hereinbelow, but one or more layers of tantalum-aluminum, without other additional layers, may be suitably employed in some embodiments of the invention. Referring to the embodiment shown in FIG. 1, a layer of amorphous tantalum-aluminum 6 is first formed over the insulator 3.

Preferably, the layer of tantalum-aluminum 6 is relatively thin, being deposited to a thickness of about 50 to about 300 Angstroms, and more preferably of about 100 to about 200 Angstroms. Preferably, the layer 6 is deposited by dc magnetron sputtering with a deposition rate of 50 nm/min in an ultra high vacuum chamber, although other conditions and techniques will be apparent to those skilled in the art. Additional description on the preparation of amorphous tantalum-aluminum can be found, for example, in H. Toyoda, et al., "Improvement in the Electromigration Lifetime Using Hyper-Textured Aluminum Formed on Amorphous Tantalum-Aluminum Underlayer," International Reliability Physics Symposium Proceedings (1994), pp. 178–184, the entire contents of which are incorporated herein by reference. Preferably, the layer of amorphous tantalum-aluminum 6 contains tantalum in a range from about 69% to about 75%.

Other conductive layers may be included in the barrier layer, preferably refractory metals or refractory metal compounds. Referring again to FIG. 1, a layer of titanium nitride 7 is deposited over the layer of tantalum-aluminum 6, generally with a thickness of about 100 to about 200 Angstroms. Next, a layer of tantalum 8 is deposited over the layer of titanium nitride 7. Typically, the thickness of the layer of tantalum 8 is about 200 to about 400 Angstroms. In depositing the layer of titanium nitride 7 and the layer of tantalum 8, conventional techniques such as chemical vapor deposition, plasma vapor deposition, sputtering, etc. may be suitably employed.

Next, a conductive layer 9 comprising copper is formed on the barrier layer 5. It should be noted that the copper content of the conductive layer 9 is relatively high, generally at least 50%, and preferably above about 65%, so that the conductive layer 9 has a relatively low resistivity. While substantially pure copper is generally preferred, small amounts of other materials may be included with the copper to, for example, improve resistance to corrosion. Other materials which may be employed in accordance with alternate embodiments of the present invention include, for example, gold, silver, nickel, and so forth.

Preferably, the conductive layer 9 is deposited by electroplating, but other techniques, such as electroless plating can be employed, as will be apparent to those skilled in the art. In accordance with the embodiment of FIG. 1, a plating base or seed layer is deposited over the barrier layer 5, using sputter deposition techniques, or other similar techniques, such as chemical vapor deposition, physical vapor deposition, etc. In this embodiment, the seed layer is copper, however, other materials may also be used, such as tungsten, titanium, tantalum, etc., depending on the form of plating technique used. Conductive material 9 is then deposited within the opening 4 using an electrolytic plating technique. In particular, the structure 1 is placed in a container of electroplate solution, an external current is applied, and the conductive material 9 grows onto the seed layer. Since the seed layer and the conductive material 9 are both copper in this example, as the conductive material 9 grows on to the seed layer the division between the seed layer and the conductive material 9 is eliminated. Once the structure 1 has been filled with conductive material 9, the surface is planarized using chemical mechanical polishing or other suitable technique.

Figure 2:
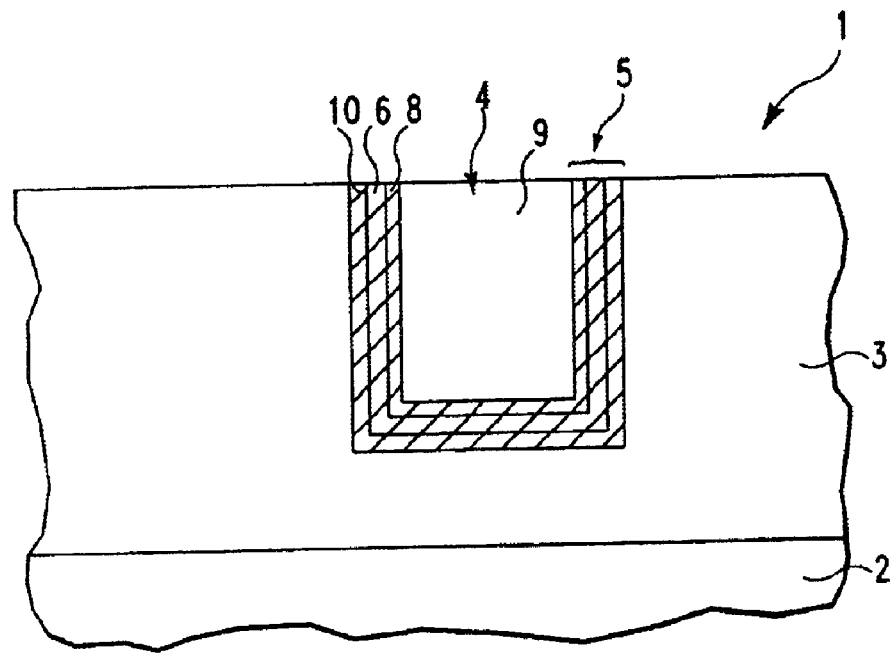

An alternative embodiment is shown in FIG. 2, in which a different combination of layers is used for the barrier layer 5. In accordance with this embodiment, the barrier layer 5 is formed by first depositing a layer of tantalum nitride 10, followed by depositing an amorphous layer of tantalum-aluminum 6 and then depositing a layer of tantalum 8.

Without being bound by theory, it is believed that several important advantages are provided by the use of a barrier layer comprising an amorphous metallic glass such as amorphous tantalum-aluminum for copper metallurgy. First, the tantalum-aluminum is in an amorphous state, with no grains, so that it blocks grain boundary diffusion paths for copper. Second, the amorphous tantalum-aluminum improves the texture of other layers deposited over it, such as other layers of the barrier layer, and of the conductive material. Because amorphous tantalum-aluminum has a relatively high surface energy, as compared with, for example, titanium nitride and titanium, a more layered growth with a small wetting angle results. In addition, the amorphous state exhibits low interfacial energy, as there are no specific crystal lattice matching constraints during film growth. Thus, the subsequently formed material will form a more stable, closely-packed configuration, yielding better textured films and better electromigration resistance.

While this invention has been described in conjunction with the specific embodiments outlined above, it is evident that many alternatives, modifications and variations will be apparent to those skilled in the art. For example, the present invention may be used in conjunction with semiconductor structures having various features, such as dual damascene, and is in no way intended to be limited to use with single damascene structures. It should also be understood that the barrier layer may comprise, in addition to a layer of amorphous tantalum-aluminum, one or more additional layers of refractory metals or refractory metal compounds, such as Ta, TaN, Ti, TiN, WN, MoN, WSiN, WSi, Nb, NbN, Cr, CrN, TaC, TaCeO$_2$, TaSiN, TiSiN, and so forth. It should also be understood that other amorphous metallic glasses that have the characteristics of structural homogeneity and the absence of crystalline defects, such as Zr-based (e.g., ZrCuAl) and Pd-based (e.g., PdCuSi) metallic glasses, would be suitable for barrier layer applications. Accordingly, the embodiments of the invention as set forth above are intended to be illustrative, not limiting. Various changes may be made without departing from the spirit and scope of the invention as defined in the following claims.

What is claimed is:

1. A semiconductor device, comprising:

a conductive layer in an opening in an insulator;

wherein said conductive layer comprises a predominant amount of copper;

wherein said insulator comprises a low-k organic material, which is a reaction product of one or more polyfunctional compounds containing two or more cyclopentadienone groups and at least one polyfunctional compound containing two or more aromatic acetylene groups wherein at least one of the polyfunctional compounds contain three or more groups selected from the group consisting of acetylene groups and cyclopentadienone groups; and a barrier layer disposed between said conductive layer and said insulator, said barrier layer comprising amorphous tantalum-aluminum, which contains about 69% to about 75% tantalum.

2. The semiconductor device of claim 1, wherein said barrier layer further comprises Ta, TaN, Ti, TIN, WN, MoN, WSiN, WSi, Nb, NbN, Cr, CrN, TaC, TaCeO$_2$, TaSiN or TiSIN or a mixture thereof.

3. The semiconductor device of claim 2, wherein said barrier layer comprises amorphous tantalum-aluminum, titanium nitride and tantalum or tantalum nitride, amorphous tantalum-aluminum and tantalum.

4. A method of making a semiconductor device, comprising the steps of:

forming an opening in an insulator which comprises a low-k organic material;

forming in said opening a barrier layer which comprises an amorphous metallic glass; and forming a seed layer on said barrier layer; and forming on said barrier layer a conductive layer which comprises a predominant amount of copper; and wherein said conductive layer is formed by electroplating on said seed layer;

wherein said amorphous metallic glass is amorphous tantalum-aluminum;

wherein said amorphous tantalum-aluminum contains tantalum in a range from about 69% to about 75%; and wherein said insulator comprises a low-k organic material, which is a reaction product of one or more polyfunctional compounds containing two or more cyclopentadienone groups and at least one polyfunctional compound containing two or more aromatic acetylene groups wherein at least one of the polyfunctional compounds contain three or more groups selected from the group consisting of acetyle groups and cyclopentadienone groups.

5. The method of claim 4, wherein said barrier layer further comprises a refractory metal or a compound thereof.

6. The method of claim 5, wherein said barrier layer comprises amorphous tantalum-aluminum, titanium and tantalum or tantalum nitride, amorphous tantalum-aluminum and tantalum.

* * * * *